United States Patent [19]

Shum et al.

[11] Patent Number: 5,397,945
[45] Date of Patent: Mar. 14, 1995

[54] DUTY CYCLE CONTROL CIRCUIT

[75] Inventors: Daniel Shum, Pasadena; Shufan Chan, Anaheim Hills, both of Calif.

[73] Assignee: Samsung Semiconductor, Inc., San Jose, Calif.

[21] Appl. No.: 925,794

[22] Filed: Aug. 4, 1992

[51] Int. Cl.⁶ .................... H03F 3/45; H03K 5/22
[52] U.S. Cl. ...................... 327/77; 327/175; 327/557
[58] Field of Search ........... 307/266, 520, 543, 351, 307/494; 328/167; 123/425, 435

[56] References Cited

U.S. PATENT DOCUMENTS

| | | | |
|---|---|---|---|
| 4,015,224 | 3/1977 | Benzinger | 328/167 |
| 4,442,814 | 4/1984 | Kubozuka | 123/425 |
| 4,752,741 | 6/1988 | Kim et al. | 307/520 X |
| 4,800,500 | 1/1989 | Tanaka | 123/425 X |
| 4,841,461 | 6/1989 | Yamamoto et al. | 328/167 X |
| 5,072,200 | 12/1991 | Ranky | 328/167 X |
| 5,227,671 | 7/1993 | Ehrlich | 307/351 X |

FOREIGN PATENT DOCUMENTS 100639  8/1979  Japan ................. 307/543

*Primary Examiner*—Willis R. Wolfe
*Attorney, Agent, or Firm*—Hecker & Harriman

[57] ABSTRACT

A circuit for converting an input signal with an arbitrary duty cycle to an output signal with a 50 percent duty cycle. A bandpass filter removes unwanted DC and high frequency components from the input signal. A comparator compares the filtered signal to a reference voltage and provides very high gain amplification to produce an output signal having a 50 percent duty cycle. In one embodiment, two bandpass filters are used to condition the signal prior to providing it to the comparator. Each bandpass stage is comprised of a low pass filter followed by a high pass filter.

11 Claims, 4 Drawing Sheets

DUTY CYCLE CONTROL CIRCUIT

BACKGROUND OF THE INVENTION

1. Field of the Invention

This invention relates generally to the field of circuits for controlling the duty cycles of signals and, in particular, circuits for providing a signal with a 50 percent duty cycle from a signal with an arbitrary duty cycle.

2. Background Art

A number of parameters may be used to describe the characteristics of an electrical signal. These include voltage, amplitude, frequency, period, duty cycle, on-time and off-time. Duty cycle is particularly relevant to signals having a digital or rectangular waveform. Digital or rectangular waveforms alternate between a low level and a high level, with the transition between levels occurring substantially instantaneously. The term "period" refers to the duration of a single cycle. For each cycle, a digital or rectangular waveform remains at the low level for a portion of the period and at the high level for the remainder of the period. "On time" refers to the amount of time spent at the high level, while "off time" refers to the amount of time spent at the low level. "Duty cycle" refers to the ratio of on time to period, and is often specified as a percentage. A signal may have a duty cycle from zero to 100 percent. In some cases, the duty cycle of a signal may be unpredictable. To make the characteristics of a signal more predictable, it is often desirable to adjust the duty cycle of the signal to be a known value, e.g. 50 percent. A 50 percent duty cycle provides equal on time and off time.

In the past, methods for controlling duty cycles have required a closed loop circuit. One circuit of the prior art is described in U.S. Patent No. 4,479,216, issued to Krambeck, et al. Krambeck describes a circuit in which the average voltage of a clock out pulse is compared to a reference voltage to produce a control signal which is fed back to adjust the timing of the clock out pulses.

Another method used for controlling the duty cycle of a signal is described in U.S. Pat. No. 4,277,697 issued to Hall, et al. Hall, et al. describes a circuit in which a generator initiates a rectangular output signal in synchronism with the input signal. A comparator compares the relative amplitudes of the output signal and another reference voltage to produce a signal which is fed back to the generator to terminate the output signal after the appropriate on time needed to produce the desired duty cycle.

Both of these methods rely on circuits of the closed loop type and require that a signal be fed back to control the output signal. Closed loop circuits must be designed carefully to avoid instability, which is inherent in such circuits. Also, some of the prior art circuits require components which are difficult or costly to fabricate as an integrated circuit. Additionally, some of the prior art circuits are difficult to adjust to achieve a 50 percent duty cycle.

SUMMARY OF THE PRESENT INVENTION

The present invention provides a circuit for producing a signal having a duty cycle of 50 percent from a signal having an arbitrary duty cycle. Since the present invention provides an open-loop circuit, the present invention avoids the potential stability problems associated with the prior art. Also, the present invention is easily and economically fabricated as an integrated circuit. The present invention produces a 50 percent duty cycle waveform; no adjustment is required.

In the present invention, an input signal of arbitrary duty cycle is applied to the input of a bandpass filter. The bandpass filter removes the DC and high frequency components of the signal, producing a bandwidth-limited output signal. This output signal is applied to a comparator and compared to a reference voltage. The output of the comparator produces a signal with the desired 50 percent duty cycle.

In the preferred embodiment of the present invention, an input signal of arbitrary duty cycle is applied to a bandpass filter. The preferred embodiment of the present invention uses a two stage bandpass filter, with each stage followed by DC biasing circuitry, although the present invention may be practiced with bandpass filters having one or more stages. The bandpass filter of the preferred embodiment of the present invention includes a low-pass filter followed by a high-pass filter. The present invention may be practiced with bandpass filters of different configurations. In the preferred embodiment of the present invention, the input signal is first applied to a low pass filter to remove unwanted high frequencies. The resulting signal is passed through a high pass filter to remove its original DC component. The filtered signal is biased at a desired voltage with respect to ground. The biased signal is amplified and may optionally be inverted.

This signal is applied to another low pass filter followed by another high pass filter and a biasing circuit to further condition the signal. The conditioned signal is coupled to an input of a comparator and compared to a reference voltage. The comparator functions as a high gain amplifier, amplifying the difference between the reference voltage and the filtered signal, thus producing a 50 percent duty cycle output signal.

The present invention provides an open loop circuit without stability problems which may be easily fabricated as an integrated circuit and does not require adjustment to achieve a 50 percent duty cycle. Thus, an efficient, reliable and economical method of providing duty cycle control is provided.

DETAILED DESCRIPTION OF THE PRESENT INVENTION

A circuit for providing a signal having a 50 percent duty cycle from a signal having an arbitrary duty cycle is described. In the following description, numerous specific details, such as a specific configuration of the bandpass filter, a specific number of stages in the bandpass filter and specific values of resistors and capacitors, etc., are described in detail in order to provide a more thorough description of the present invention. It will be apparent, however, to one skilled in the art, that the present invention may be practiced without these specific details. In other instances, well known features have not been described in detail so as not to unnecessarily obscure the present invention.

In digital systems and electronic circuits, signals are often encountered which have arbitrary or unpredictable duty cycles. Signals with well defined duty cycles are distorted by noisy or lossy circuitry suffering from the effects of parasitics, process variations and environmental conditions. A 50 percent duty cycle is often desired because many circuits rely on the symmetric characteristics of a waveform in coordinating operations. Thus, a circuit for converting a signal having an arbitrary duty cycle into a signal having a 50 percent duty cycle is needed.

Prior art methods have included closed loop circuits which compare the average voltage of an output signal to a reference voltage and feed back a signal to adjust the output signal to a 50 percent duty cycle. One disadvantage of closed loop circuits is that they are inherently susceptible to becoming unstable. Such circuits must be carefully designed so as to prevent instability. Another disadvantage of the prior art methods is that they require many components which are difficult or costly to fabricate as an integrated circuit. Also, some of the prior art methods require precise adjustment to achieve a 50 percent duty cycle.

Figure 1:
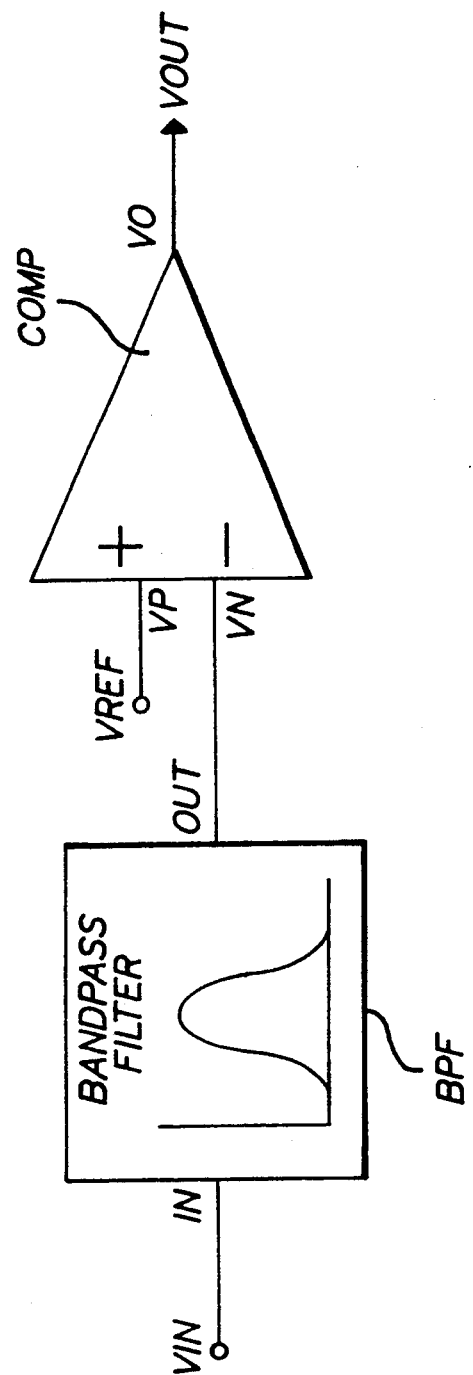
FIG. 1 is a block diagram illustrating the present invention.

A block diagram of the present invention is illustrated in FIG. 1. Input signal VIN is coupled to input IN of bandpass filter BPF. Bandpass filter BPF removes the DC and high frequency components of the input signal and produces output signal OUT. Output signal OUT is coupled to inverting input VN of comparator COMP. Reference voltage signal VREF is coupled to non-inverting input VP of comparator COMP. Comparator COMP produces output signal VOUT at output VO.

In the present invention, the comparator COMP can be implemented as a traditional comparator or any of a plurality of ways. For example, the comparator can be implemented as a high gain differential amplifier, a high gain transconductance amplifier, a subtractor, clipping circuit and zero detector, a high pass filter, clipping circuit and zero detector, or a threshold detector. Alternatively, the comparator can be implemented as a zero detector and a clipping circuit, (e.g. a high gain inverter), or a clipping circuit and a squaring circuit.

In operation, input signal VIN, a clock signal having an arbitrary duty cycle, is provided to the bandpass filter BPF. The signal VIN includes unwanted frequency components, which cause it to possess a duty cycle greater or less than 50 percent. The bandpass filter BPF removes the DC and higher frequency components from input signal VIN. The output OUT of the bandpass filter BPF is a well conditioned signal that is provided to the inverting input VN of a comparator COMP. The non-inverting input VP of comparator COMP is coupled to a reference voltage VREF. The comparator is used to generate a square wave output from the input signal VN. When VN is less than VREF, a constant voltage output is provided by the comparator. When VN is greater than VREF, a second different constant voltage output is provided by the comparator COMP. The present invention provides a clock output with substantially a 50% duty cycle, in an open loop configuration.

The present invention, being an open loop circuit, avoids the inherent potential for instability in closed loop circuits. The present invention may be implemented with components that are easily fabricated as an integrated circuit. Additionally, the present invention does not require adjustment to produce a 50 percent duty cycle signal. Thus, the disadvantages associated with the prior art are avoided.

Figure 2:
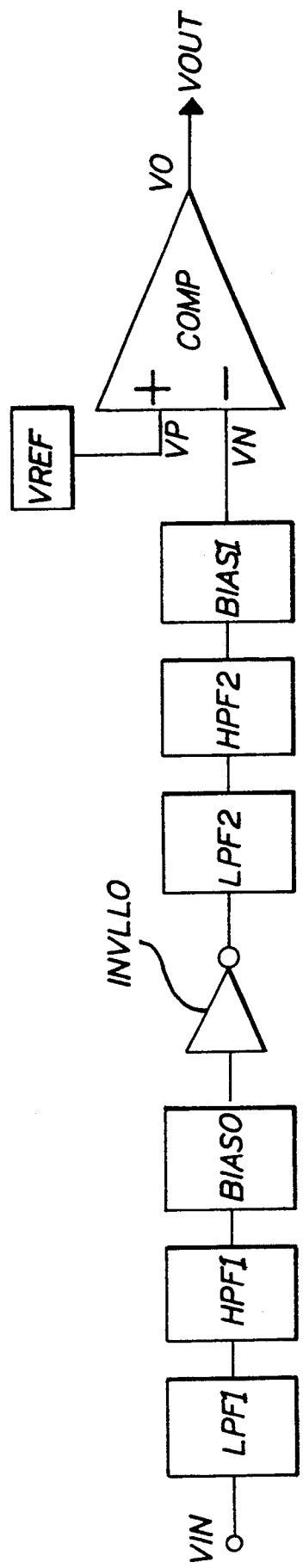
FIG. 2 is a block diagram of the preferred embodiment of the present invention.

A schematic diagram of the preferred embodiment of the present invention is illustrated in FIG. 2. In the preferred embodiment, bandpass filter BPF of FIG. 1 is implemented as a two stage bandpass filter. Each stage is implemented as a low pass filter followed by a high pass filter.

Input signal VIN is applied to low pass filter LPF1. The output of low pass filter LPF1 is coupled to the input of high pass filter HPF1. The output of high pass filter HPF1 is coupled to the input of biasing circuit BIAS0. The output of biasing circuit BIAS0 is coupled to the input of inverter INVLL0. The output of inverter INVLL0 is coupled to the input of low pass filter LPF2. The output of low pass filter LPF2 is coupled to the input of high pass filter HPF2. The output of high pass filter HPF2 is coupled to the input of biasing circuit BIAS1. The output of biasing circuit BIAS1 is coupled to the inverting input VN of comparator COMP. The output of voltage reference VREF is coupled to the non-inverting input VP of comparator COMP. Comparator COMP's output VO is coupled to output signal VOUT.

As illustrated in FIG. 2, input signal VIN is first low pass filtered by low pass filter LPF1 to remove unwanted high frequency components. The output of low pass filter LPF1 is provided to high pass filter HPF1, where DC components of the filtered signal are removed. The output of HPF1 is provided to bias circuit BIAS0, where it is biased to an appropriate level. This signal is amplified and inverted by inverter INVLL0.

The amplified and inverted signal is provided to the second stage of the bandpass filter, starting with low pass filter LPF2, to further remove unwanted high frequency components. The filtered signal is high pass filtered by high pass filter HPF2 to remove the DC components. The high pass filtered signal is biased to an appropriate level by bias circuit BIAS1. Thus, a well conditioned bandwidth-limited signal is presented to the inverting input VN of comparator COMP.

VREF produces a reference voltage equal to the bias voltage provided by BIAS1 and presents it to non-inverting input VP of comparator COMP. Comparator COMP highly amplifies the voltage difference present at non-inverting input VP and inverting input VN. Since the voltage output VO of comparator COMP is limited by the power supply voltage(s) of comparator COMP, the output of comparator COMP is a rectangular waveform. The waveform displays very rapid transitions as a result of the very high gain of the amplifier. The signal is clipping due to the limitations on output voltage imposed by the finite supply voltage(s) of comparator COMP.

Figure 3:
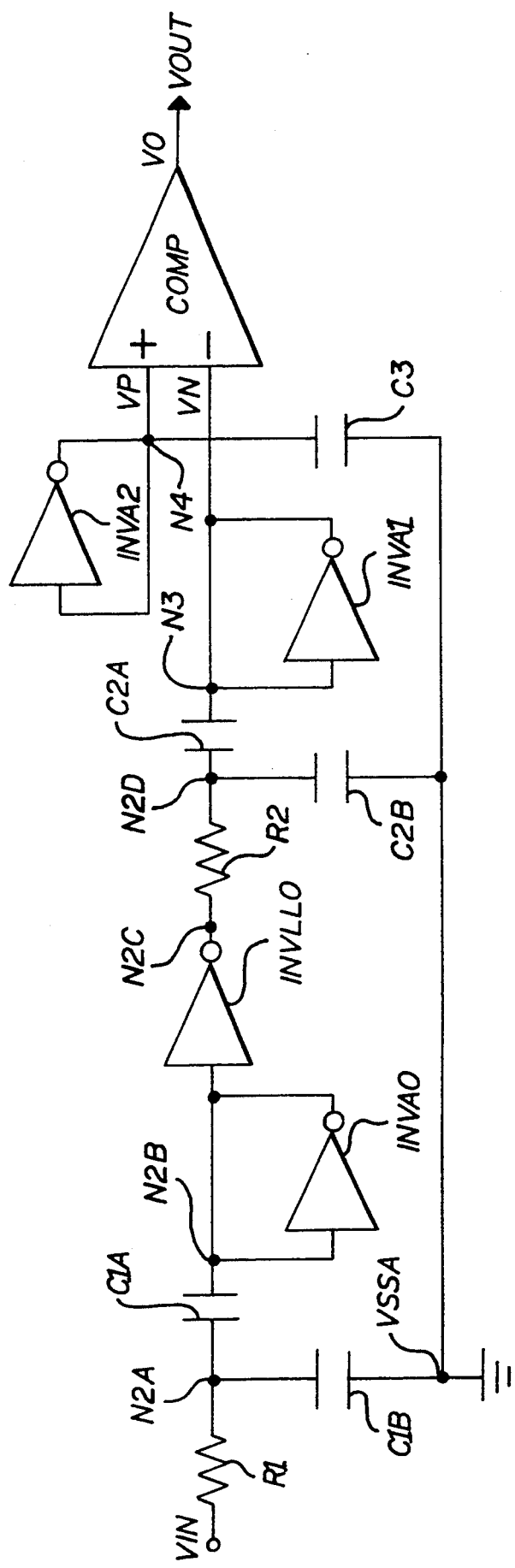
FIG. 3 is a schematic diagram illustrating the preferred embodiment of the present invention.

FIG. 3 illustrates the preferred embodiment of the blocks used to implement the high pass and low pass filters in the embodiment of FIG. 2. The low pass filter LPF1 is comprised of resistor R1 and capacitor C1B. Input signal VIN is coupled to the first terminal of resistor R1. The second terminal of resistor R1 is coupled to node N2A, the first terminal of capacitor C1A, and to the first terminal of capacitor C1B. The second terminal of CIB is coupled to ground, node VSSA.

The high pass filter HPF1 is implemented with capacitor C1A. The bias circuit BIAS0 is implemented with inverter INVA0. The second terminal of capacitor C1A is coupled to node N2B, the input of inverter INVA0 and the input of inverter INVLL0. The output of inverter INVA0 is also coupled to the input of inverter INVLL0.

The second low pass filter is comprised of resistor R2 and capacitor C2B. The output of inverter INVLL0 is coupled to the first terminal of resistor R2. The second terminal of resistor R2 is coupled to node N2D, the first terminal of capacitor C2A, and the first terminal of capacitor C2B. The second terminal of capacitor C2B is coupled to ground, node VSSA.

The second high pass filter is implemented with capacitor C2A, and the second bias circuit BIAS1 is comprised of inverter INVA1. The second terminal of capacitor C2A is coupled to node N3, the input of inverter INVA1, the output of inverter INVA1, and the inverting input VN of comparator COMP. VREF is generated with feedback inverter INVA2. The input of inverter INVA2 is coupled to node N4, the output of inverter INVA2, the first terminal of capacitor C3, and the non-inverting input VP of comparator COMP. The second terminal of capacitor C3 is coupled to ground, node VSSA. Output VO of comparator COMP is coupled to output signal VOUT.

Resistor R1 and capacitor C1B function together to form a low pass filter LPFI, which removes unwanted high-frequency components from input signal VIN. Capacitor C1A serves to block the DC component of the signal, thus functioning as a high pass filter HPF1. Inverter INVA0 ensures that the signal at node N2B is biased at the proper voltage with respect to ground BIAS0. Inverter INVLL0 amplifies and inverts the signal. Resistor R2 and capacitor C2B function as a second low pass filter LPF2, to further remove unwanted high-frequency components from the signal. Capacitor C2A blocks the DC component of the signal, thus functioning as a second high pass filter HPF2. Inverter INVA1 ensures that the signal at node N3 is properly biased with respect to ground. Inverter INVA2, in conjunction with capacitor C3, provides a reference voltage VREF at non-inverting input VP of comparator COMP. Comparator COMP compares the filtered and conditioned signal at inverting input VN to the reference voltage at non-inverting input VP and provides very high gain amplification to produce output signal VOUT at output VO. Since the voltage at output VO is constrained by the power supply limits of comparator COMP, the waveform of the output voltage alternates between the extremes of the output voltage range of comparator COMP, thus producing a rectangular output waveform with a 50 percent duty cycle.

Figure 4:
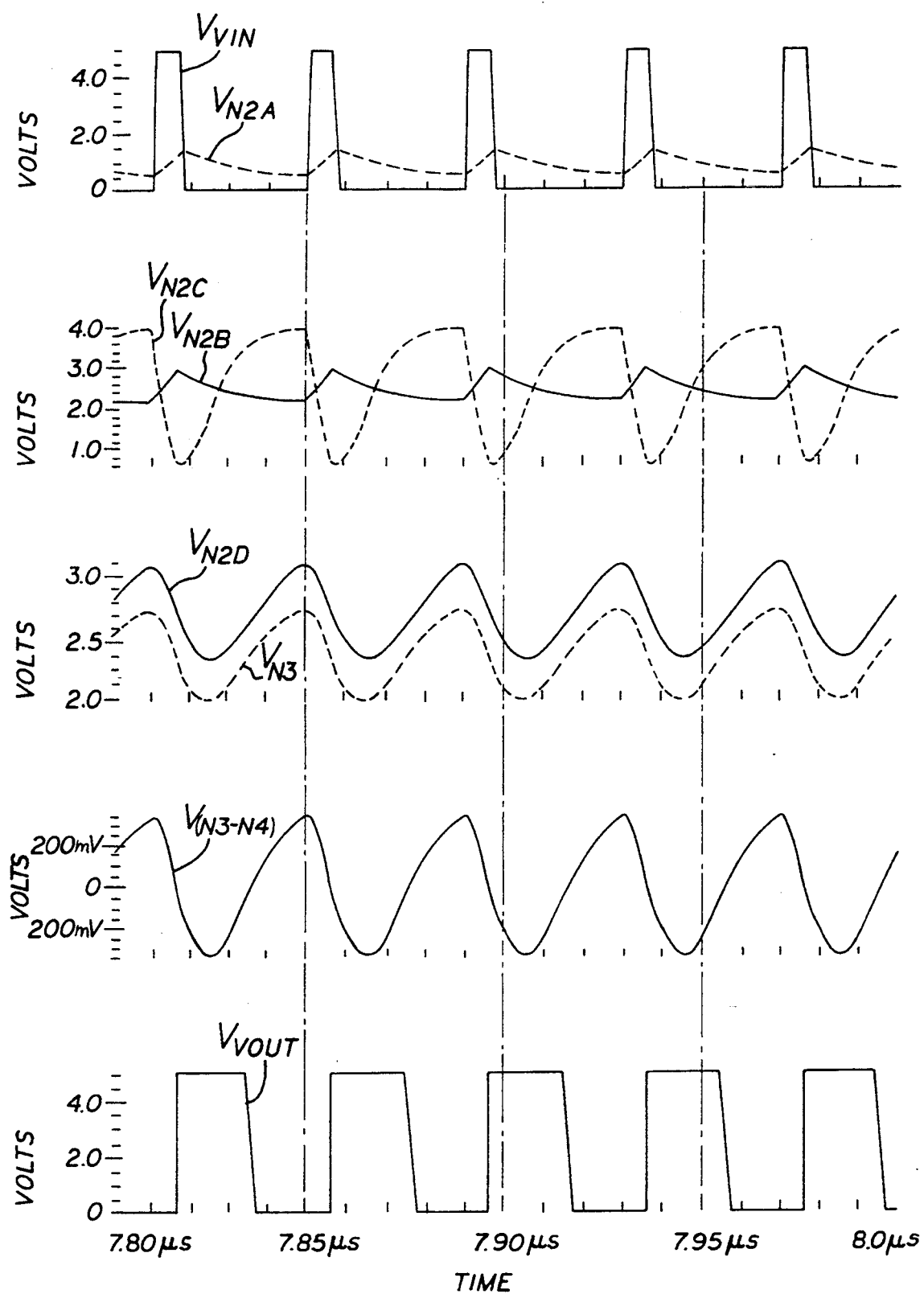
FIG. 4 is a diagram illustrating the waveforms of signals in the preferred embodiment of the present invention.

FIG. 4 illustrates the waveforms present at various nodes in FIGS. 2 and 3 when the waveform illustrated as VVIN is applied at input VIN. VVIN is a periodic pulse waveform of arbitrary duty cycle. It is the sum of many different frequency components, including a DC component. Low pass filter LPF1 removes high frequency components from VVIN to produce waveform VN2A which is present at node N2A. VN2A is a generally triangular-shaped waveform, displaying the same periodicity as VVIN. High pass filter HPF1 blocks the DC component of waveform VN2A and BIAS0 biases the signal at a desired DC voltage level to produce waveform VN2B at node N2B. VN2B has the same shape as VN2A, but a different DC component.

Inverter INVLL0 amplifies and inverts waveform VN2B to produce waveform VN2C, which is present at node N2C. VN2C is an amplified inversion of VN2B. Low pass filter LPF2 removes the remaining unwanted high frequency components of waveform VN2C to produce waveform VN2D which is present at node N2D. VN2D is an approximately sinusoidal waveform displaying the same periodicity as the original input signal VVIN. High pass filter HPF2 blocks the DC component of waveform VN2D and BIAS0 provides the appropriate DC bias to produce waveform VN3 at node N3. VN3 has the same shape as VN2D, but a different DC component.

Waveform V(N3-N4) illustrates the difference between the voltages at nodes N3 and N4. V(N3-N4) has the same shape as VN2D, but no DC component. As such, waveform V(N3-N4) illustrates the difference between the voltage levels present at the inverting input VN and non-inverting input VP of comparator COMP. Comparator COMP amplifies the voltage difference illustrated by waveform V(N3-N4) to produce an output VOUT illustrated by the waveform VVOUT. VVOUT is a square waveform displaying the same periodicity as the original input waveform VVIN. The very high gain of comparator COMP causes the edges of each pulse of VVOUT to be extremely steep. VVOUT is constrained by the output voltage limitations imposed by the finite supply voltages of comparator COMP (in this case 5 V and ground). As illustrated in FIG. 4, output waveform VVOUT has the desired 50 percent duty cycle.

The present invention provides an open loop circuit for converting an input signal having an arbitrary duty cycle to an output signal having a 50 percent duty cycle. The present invention is an efficient, reliable and economical method of providing a signal with a 50 percent duty cycle.

We claim:

1. A method of providing a clock signal having a substantially 50% duty cycle comprising the steps of:
   providing an input clock signal having an arbitrary duty cycle to a bandpass filter;
   removing high frequency and DC components from said input clock signal using said bandpass filter to generate a conditioned signal;
   providing said conditioned signal to a comparator and comparing said conditioned signal to a reference;
   generating a clock signal having a first level when said conditioned signal is less than said reference signal and a clock signal having a second level when said conditioned signal is greater than said reference signal.

2. The method of claim 1 wherein said bandpass filter comprises a low pass filter and a high pass filter.

3. A method of providing a clock signal having a substantially 50% duty cycle comprising the steps of:
   providing an input clock signal having an arbitrary duty cycle to a first bandpass filter;
   removing high frequency and DC components from said input clock signal using said first bandpass filter to generate a first conditioned signal;
   providing said first conditioned signal to a second bandpass filter;
   removing high frequency and DC components from said first conditioned signal using said second bandpass filter to generate a second conditioned signal;
   providing said second conditioned signal to a comparator and comparing said second conditioned signal to a reference;

generating a clock signal having a first level when said second conditioned signal is less than said reference signal and a clock signal having a second level when said second conditioned signal is greater than said reference signal.

4. The method of claim 3 wherein said each of said first bandpass filter and said second bandpass filter comprises a low pass filter and a high pass filter.

5. A circuit for controlling the duty cycle of a signal comprising:

a bandpass filter for receiving an input signal and for providing a filtered signal, said bandpass filter comprising a plurality of stages, said bandpass filter further comprising amplifying means between said stages;

a comparator coupled to said bandpass filter for receiving said filtered signal and for providing an output signal; and a reference voltage coupled to said comparator.

6. The circuit of claim 5 wherein said bandpass filter comprises a low pass filter and a high pass filter.

7. The circuit of claim 6 wherein said low pass filter comprises a resistor and a capacitor.

8. The circuit of claim 6 wherein said high pass filter comprises a capacitor.

9. The circuit of claim 9 wherein each of said stages comprises a low pass filter and a high pass filter.

10. The circuit of claim 9 wherein said low pass filter comprises a resistor and a first capacitor and wherein said high pass filter comprises a second capacitor.

11. The circuit of claim 10 wherein said input signal is coupled to a first terminal of said resistor of said first stage; a second terminal of said resistor of said first stage is coupled to a first terminal of each of said first and second capacitors of said first stage; a second terminal of said second capacitor of said first stage is coupled to an input of said inverter of said first stage, an output of said inverter of said first stage, and an input of said amplifying means; an output of said amplifying means is coupled to a first terminal of said resistor of said second stage; a second terminal of said resistor of said second stage is coupled to a first terminal of each of said first and second capacitors of said second stage; a second terminal of said second capacitor of said second stage is coupled to an input of said inverter of said second stage, an output of said inverter of said second stage, and a second input of said comparator.

* * * * *

UNITED STATES PATENT AND TRADEMARK OFFICE
CERTIFICATE OF CORRECTION

PATENT NO. : 5,397,945

DATED : MARCH 14, 1995

INVENTOR(S): DANIEL SHUM et al.

It is certified that error appears in the above-identified patent and that said Letters Patent is hereby corrected as shown below:

On column 8, line 3, please delete:

--"The circuit of claim 9" and insert in place thereof--The circuit of claim 5--.

Signed and Sealed this

Twenty-fourth Day of October, 1995

Attest:

BRUCE LEHMAN

Attesting Officer

Commissioner of Patents and Trademarks